United States Patent [19]

Hanni et al.

[11] 4,074,419
[45] Feb. 21, 1978

[54] PRINTED WIRING BOARD WITH ANGLED PORTION AND ITS METHOD OF MANUFACTURE

[75] Inventors: Stephen L. Hanni, Richardson; Dudley B. Johnson, Irving, both of Tex.

[73] Assignee: Texas Instruments Incorporated, Dallas, Tex.

[21] Appl. No.: 667,333

[22] Filed: Mar. 16, 1976

[51] Int. Cl.² ............................................. H05K 3/00
[52] U.S. Cl. ...................................... 29/625; 174/68.5
[58] Field of Search ............... 29/625, 626, 627, 628, 29/622, 624; 174/68.5; 317/101 F, 101 R, 101 C, 101 CC, 101 B, 101 A, 101 CM, 101 CP, 101 D, 101 DH; 339/17 R, 17 A, 17 F

[56] References Cited

U.S. PATENT DOCUMENTS

| | | | |
|---|---|---|---|
| 3,296,099 | 1/1967 | Dinella | 29/626 X |
| 3,334,395 | 8/1967 | Cook et al. | 339/17 R X |
| 3,385,732 | 5/1968 | Curran | 428/145 X |
| 3,911,234 | 10/1975 | Kotaka | 200/5 A |
| 3,930,115 | 12/1975 | Uden | 317/101 CC X |
| 3,934,334 | 1/1976 | Hanni | 29/625 |
| 3,934,335 | 1/1976 | Nelson | 29/625 |
| 3,971,127 | 7/1976 | Giguere et al. | 29/626 |

*Primary Examiner*—Milton S. Mehr
*Attorney, Agent, or Firm*—Rene E. Grossman; James T. Comfort; Richard P. Berg

[57] ABSTRACT

An improved printed wiring board having a substrate disposed in at least two major planes and having conductors affixed to the substrate traversing between the at least two major planes. Further a method of manufacturing such an improved printed wiring board having a metal substrate is disclosed.

10 Claims, 6 Drawing Figures

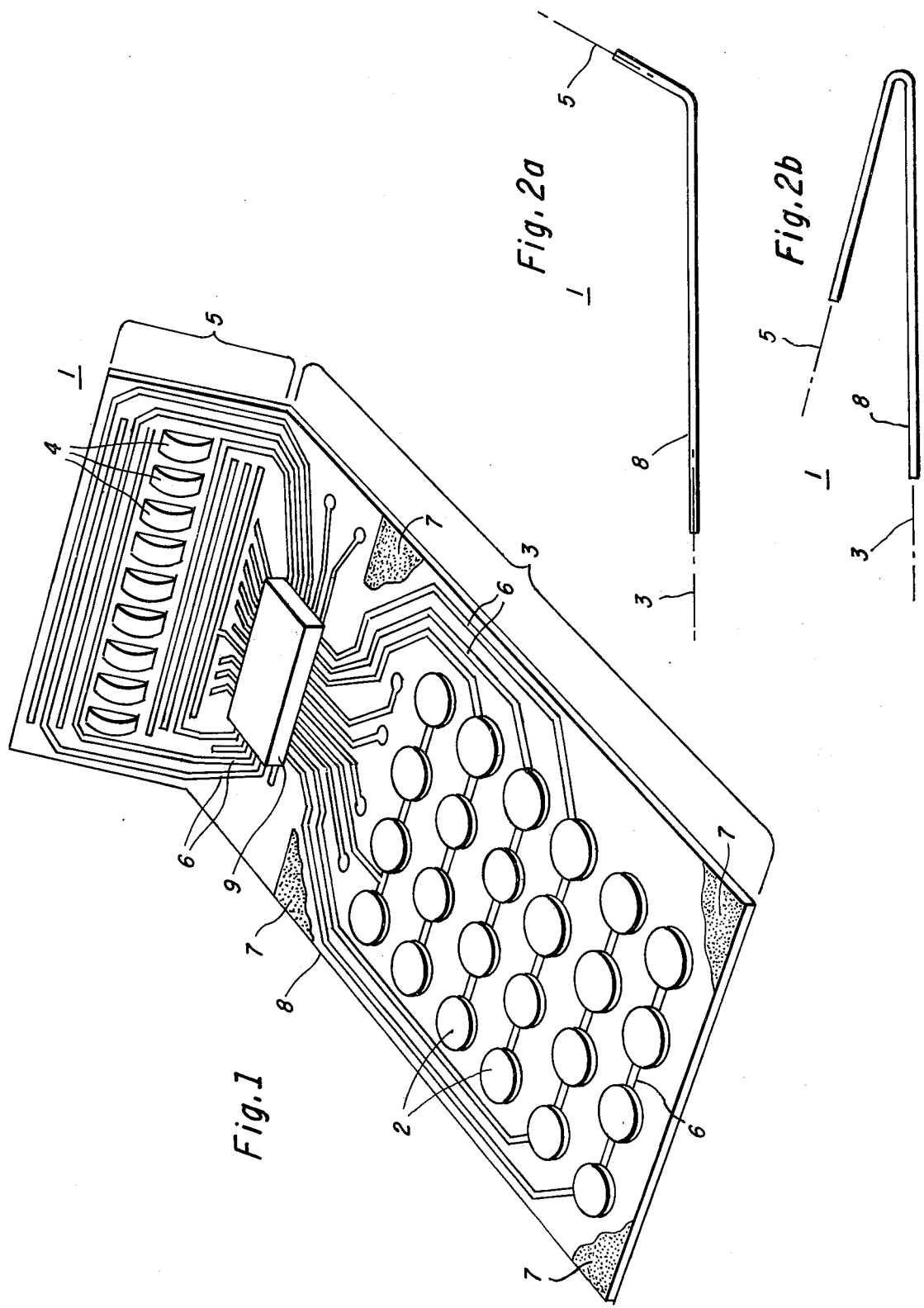

PRINTED WIRING BOARD WITH ANGLED PORTION AND ITS METHOD OF MANUFACTURE

This invention relates to printed wiring boards and more specifically to printed wiring boards disposed in at least two major planes, thus forming angled portions with respect to each other and having conductors affixed to the board traversing between the major planes.

Printed wiring boards have been utilized in virtually every segment of the electronics industry because of the increased reliability and decreased cost compared to hand wiring techniques. Prior art printed wiring boards, generally, have been of planar configuration. That is, the prior art is characterized by printed wiring boards which have occupied only one major plane. Nevertheless, there has been a proposal to use a nonplanar printed circuit board in the telephone industry. That printed wiring board has two major planes located at right angles; the first major plane being used to mount the circuit components and the second major plane (of substantially less area than the first major plane) being used merely as a handle to help extract the printed wiring board from an electrical plug. The conductors on this printed wiring board are affixed only to that portion of the substrate located in the first major plane. A recent proposal to use a nonplanar printed wiring board is disclosed by U.S. Pat. No. 3,385,732, issued May 28, 1968. The nonplanar printed wiring board disclosed thereby has conductors extending between two major noncoplanar surfaces, but the board is manufactured by bending a metal substrate and then forming a nonductile insulating layer on the metal substrate. This technique has certain drawbacks in that it is difficult to image or print the paths to be taken by the conductors on a nonplanar surface and because it is preferable to delay bending to near the end of the fabrication process, if the printed wiring board is to be mass produced.

Planar printed wiring boards have been used in the manufacture of modern appliances such as the electronic calculator. In an electronic calculator a keyboard is typically associated with a printed wiring board and is used to input data and command signals. Display devices are also typically mounted or adjacent a printed wiring board and are used to display out putted answers. It is often desirable to mount the display devices on a plane tilted or angled to the plane of the keyboard in order to position the display devices in a better attitude for viewing by a person operating the calculator. Prior art calculators have typically either used a plurality of printed wiring boards to accomplish this desirable result or have used a single printed wiring board and have foregone this desirable result.

The use of a plurality of printed wiring boards increases cost and complexity and reduces reliability because of the required additional soldered connections used to interconnect the various printed wiring boards. It has been discovered that the use of a single printed wiring board located in two major planes eliminates the necessity for these interconnections while achieving the desired result facilitating the location of the display devices in a superior attitude for viewing.

Briefly, in accordance with the inventive improvements herein described, a single printed wiring board, portions of which are disposed in at least two major planes, is advantageously employed, thereby simplifying construction techniques and eliminating soldered connections otherwise required to interconnect a plurality of printed wiring boards. Generally, in accordance with one embodiment of the improved printed wiring board method of manufacture herein described, a ductile metal substrate having a planar configuration is first coated with a ductile insulating material and subsequently ductile conductors are formed on the insulated substrate. After the conductors have been formed on the insulated substrate, the board is then bent at desired locations to cause the board to be disposed in at least two major planes. Bending operations may be accomplished before, during, or after component mounting and soldering operations. In an alternate embodiment of the method of manufacture, bending is accomplished before conductors are formed on the insulated substrate.

It is one object of this invention to improve printed wiring boards.

It is another object of this invention to improve the ability of the printed wiring board to be mechanically formed.

It is yet another object of this invention to permit a hand-held electronic calculator to be designed based on the use of a single printed wiring board with display devices mounted on a major plane tilted to the major plane defined by the keyboard.

It is still another object of this invention to eliminate the soldered connections needed to interface the components mounted on one printed wiring board with components mounted on an associated printed wiring board.

It is still yet another object of this invention to provide a method of manufacturing a metal substrate printed wiring board which can be mechanically formed after or before the conductors have been formed thereon.

In accordance with one feature of this invention, components may be mounted on a first portion of a printed wiring board and other components may be mounted on a second portion of the same printed wiring board but which is or will be located in a plane angled to the plane defined by the first portion with conductors interconnecting the various components.

In accordance with another feature of this invention, soldered connections used to interconnect adjacent printed wiring boards are reduced or eliminated.

In accordance with yet another feature of this invention, hand-held calculators may be fabricated on the basis of a single printed wiring board with keys mounted on a first portion of the printed wiring board and in which display devices are mounted on a second portion of the printed wiring board which is or will be located in a plane angled to the first portion in order to locate the display devices in a superior attitude for viewing.

These and other objects and features of this invention will be evident from the following detailed description and claims with reference to the drawings in which:

FIG. 1 is a perspective view of a printed wiring board with components mounted thereon and embodying the present invention;

FIGS. 2a–2d are sectional side views of printed wiring boards embodying the present invention.

Figure 2C:
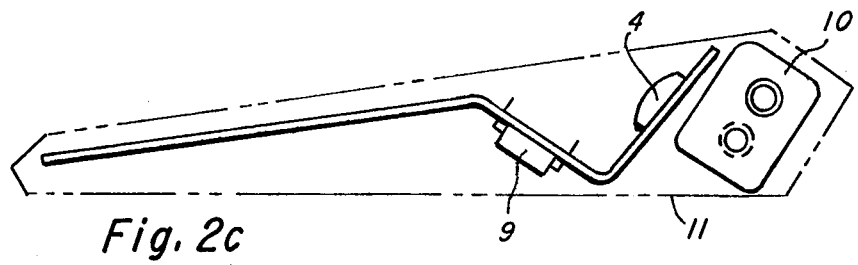

Referring now to FIG. 1, an assembly embodying the present invention is shown which includes a printed wiring board 1 comprising a substrate 8, momentary switches 2 comprising a keyboard mounted on a first major plane 3 of the printed wiring board 1, display devices 4 mounted on a second major plane 5 of the printed wiring board 1 and an integrated circuit 9 mounted on major plane 3. Conductors 6 affixed to the printed wiring board 1 interconnect the momentary switches 2 display devices 4 and integrated circuit 9. An optional protective covering 7 covers desired areas. By adding a switch, batteries 10 (FIG. 2c) interconnecting wires and a case 11 (FIG. 2c) with key pushbuttons to the above described assembly a complete hand-held calculator results.

Referring now to FIGS. 2a–2d, in FIG. 2a there is shown a sectional side view of the printed wiring board 1 having a portion occupying a first major plane 3 and a portion occupying a second major plane 5 such that the planes defined by the two portions formed an obtuse angle.

Figure 2D:
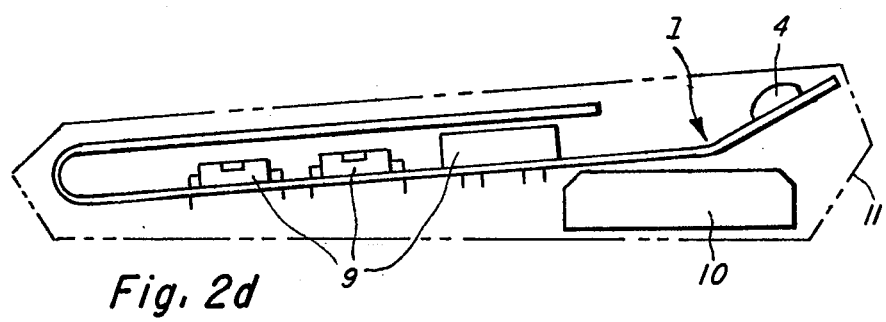

Alternate embodiments of the invention are depicted in FIGS. 2b–2d. Referring now to FIG. 2b, there is shown another embodiment similar to that shown in FIG. 2a and thereinbefore described except that the angle formed by the planes 3 and 5 defined by the portions of the printed wiring board 1 is an acute angle.

Still other embodiments are depicted in FIGS. 2c and 2d where there are shown embodiments similar to that shown in FIGS. 2a and 2b except that more than two major planes are defined by different portions of one printed wiring board and the printed wiring board is shown with components and installed in a case 11.

It has been found that printed wiring boards 1 such as those hereinbefore described can be satisfactorily manufactured in bulk or individually if the printed wiring board 1 includes a substrate 8 which is sufficiently ductile to permit bending to the desired configuration after the conductors have been formed thereon. This method therefore permits the conductors to be imaged on the board while it is still in a planar configuration thereby permitting the imaging to be done by conventional processes. Substrate materials having sufficiently ductility include sheet steel, copper, or aluminum or alloys thereof having a thickness of 5–100 mils but preferably a thickness of 15–30 mils.

Each of the aforementioned substrate materials will conduct electrically and thus an insulating layer is affixed to the substrate and the printed wiring board conductors 6 are formed on the insulated substrate 8. As is the case with the substrate material, the insulating layer must have sufficiently ductility to withstand bending operations occurring after it has been affixed to the substrate.

U.S. Pat. No. 3,934,334 issued to Stephen L. Hanni on Jan. 27, 1976, and assigned to the assignee of this invention, discloses a method of fabricating metal substrate printed wiring boards, the substrates of which are isolated by an electrostatically applied insulating layer and the conductors of which are electrolessly applied to an adhesive layer affixed to the insulating layer. U.S. Pat. No. 3,934,334 is hereby incorporated herein by reference.

U.S. Pat. No. 3,934,335 issued to Mark A. Nelson on Jan. 27, 1976, and assigned to the assignee of this invention discloses a method of fabricating printed wiring boards having conductors which are electrolessly applied to an imaged photosensitive layer applied to the insulating layer. U.S. Pat. No. 3,934,335 is hereby incorporated herein by reference.

It has been found that utilizing the method and material disclosed in U.S. Pat. No. 3,934,334 for bulk or individually blanking and cleaning the substrate, applying the insulating layer and forming the conductors provides a printed wiring board with insulating layer and copper conductors having the necessary ductility. The method and materials of U.S. Pat. No. 3,934,335 may alternatively be used to form the conductors on the insulated substrate. Preferably, the conductors are formed on the insulated substrate according to the method disclosed in U.S. Pat. No. 3,934,334, modified so as to selectively apply the adhesive layer where conductors are desired to be formed, for example, by screen printing the adhesive layer on the insulated substrate, rather than screening on the adhesive layer over substantially all the insulated substrate and selectively screening in a plating resist, as is taught in U.S. Pat. No. 3,934,334.

While various thicknesses of insulation and conductors can be applied by the aforementioned methods it has been found that the insulating layer should preferably be approximately 5 mils thick and the conductors should preferably be approximately 1 mil thick. Of course, other thicknesses will be found to be operable and within the spirit and scope of this invention. The copper conductors which are formed in areas where the substrate and insulating layer eventually will be bent can be formed on either or both sides of the printed wiring board. If multi-layered conductors are used on the printed wiring board, they should either not be used in areas which will subsequently be bent or the bends in multi-layered areas should have longer than normal radii because multi-layering reduces printed wiring board ductility. Multi-layering can be accomplished, for instance, by the techniques disclosed in U.S. Pat. No. 3,934,335, U.S. patent application Ser. No. 509,530, filed Sept. 26, 1974 or by screening a dielectric such as that sold under the trade name PC401 by Photocircuits Inc. in areas where a conductor is to pass over another conductor without making electrical contact; then a conductive ink such as that sold under the trade name LTC 1000 by Methode Development Co. is screened onto the printed wiring board in selected areas to make desired electrical connections between conductors affixed to the insulated substrate.

Where small radius bends are to be employed, the ability of the conductors to withstand bending forces can be improved if the conductors are formed along lines in the bend areas which are nonperpendicular to the axis of the bend.

Figure 3:
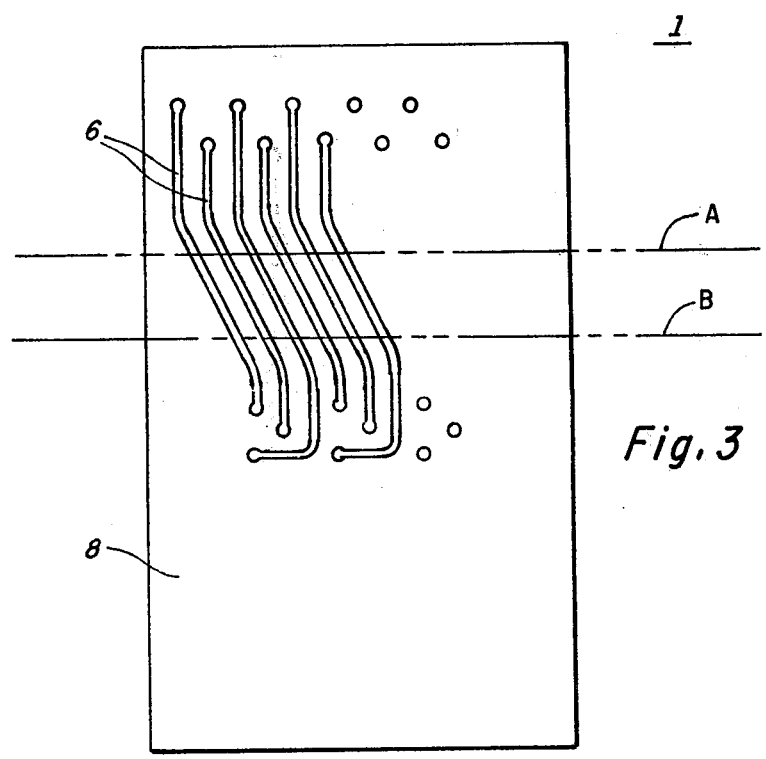
FIG. 3 is a top view of a printed wiring board before bending with a conductor formed thereon in the area to be bent.

In FIG. 3, a printed wiring board 1 is shown in a planar configuration prior to bending. The portion of the printed wiring board which will be subjected to bending forces is the region between reference lines A and B. The conductors 6 formed on the printed wiring board in the region between references A and B are shown as being formed nonperpendicular to the axis of the bend, which axis is parallel to references A and B. The ability of the conductors 6 to withstand bending forces is increased by disposing the conductors at an angle to the axis of the bend.

Having applied the insulating layer and formed the conductors on the insulating layer, the printed wiring board should be dried and a protective layer, such as a solder mask, applied. Reference is made to the method and materials disclosed in U.S. Pat. No. 3,934,334 for drying, deburring and applying a protective layer. The printed wiring boards may then be inspected. U.S. Pat. No. 3,934,334 discloses a bulk manufacturing technique wherein the substrates are in the form of a long continuous ribbon, the individual substrates being retained by a lead frame and the lead frame being equipped with index fixtures, such as sprocket holes. The ribbon of substrates may be coiled. If this technique is followed, the printed wiring boards may be recoiled and placed in a loader or passed through a blanking press to cut out the printed wiring board one from another and from the lead frame for packaging and shipping to an assembly area.

The coil of printed wiring boards or stack of printed wiring boards may be shipped to an assembly area on a supporting pallet. At the assembly area the coiled printed wiring boards may be unwound and, if desired, the lead frame and index fixtures may be utilized as a means for controlling the positioning of the printed wiring boards. At the assembly line electronic components may be assembled onto the uncoiled or individual printed wiring boards and their leads attached to conductors formed on the printed wiring boards. The leads are electrically coupled to the printed wiring board, preferably by wave soldering techniques. For wave soldering, the board is foam or wave coated with suitable flux such as, for example, that sold under the trademark Alpha 711 Flux. The board may then be preheated to 170°-210° F in a preheated oven and wave soldered at 3-6 feet per second in a flowing stream of solder pumped through an orifice at 480° F. Contact time with the wave is 5-10 seconds. Wave soldering, cleaning and tests can all be done while using the lead frame material handling device.

After wave soldering the printed wiring boards are bent, such as, for example, by a press utilizing a mandrel and die or by a roller press, locating portions of the boards in at least two planes having an angle or angles of incidence defined, for example, by the press configuration. The inside radius of the bend is approximately equal, for example, to the radius of the mandrel or roller. It has been found that bend radii as small as 0.25 inch or less will yield satisfactory results if the bending is accomplished carefully and the aforementioned precautions are observed.

In another embodiment of the method of manufacturing the improved printed wiring boards, printed wiring board bending may be accomplished before or during the assembly operations whereby the active components are mounted on and soldered to the printed wiring board.

In yet another embodiment, bends having a radius as small as 0.01 inch may be obtained by bending the boards to the desired configuration prior to forming the conductors on the insulated substrate. It has been found that the conductor pattern can be imaged while the board is still in a planar configuration and subsequently bent if a plating resist of suitable ductility, such as that sold under the trade SPR6309, Grace and Company of Columbia, Md., is utilized.

Having described the invention in connection with certain embodiments thereof, it is to be understood that further modification may now suggest itself to those skilled in the art, for example, 90° or 180° bends could be made in lieu of acute or obtuse angle bends. It is understood that the invention is not to be limited to the specific embodiments described herein except as set forth in the appended claims.

What is claimed is:

1. A method of manufacturing a printed wiring board with an angled portion comprising:
    (a) forming a metal substrate;
    (b) coating the metal substrate with an insulating material;
    (c) additively forming a plurality of conductors on the insulating material after the step of coating said substrate; and
    (d) bending the insulated metal substrate and at least one conductor formed thereon, thereby causing the insulated substrate to occupy at least two major planes.

2. A method of fabricating a printed wiring board with an angled portion according to claim 1 wherein coating the said metal substrate comprises applying the insulating material electrostatically and then fusing the electrical insulating material to provide insulation on at least one major surface of the metal substrate.

3. A method of manufacturing a printed wiring board with an angled portion according to claim 1 further including mounting electrical components on the printed wiring board after bending.

4. A method of manufacturing a printed wiring board with an angled portion according to claim 1 further including mounting the electrical components on the insulated substrate before the insulated substrate is bent but after the conductors have been formed on the insulated substrate.

5. A method of fabricating a printed wiring board with an angled portion according to claim 1 wherein said insulating material is applied as a smooth substantially pin hole free layer approximately 5 mils thick.

6. A method of manufacturing printed wiring boards with angled members comprising:
    (a) blanking sheet metal for outlining a plurality of metal substrates;
    (b) forming lead frames adjacent horizontally disposed edges of the sheet metal with sprocket holes therein for use in advancing the sheet metal;
    (c) preparing the substrates for coating with a layer of insulating material;
    (d) coating the surfaces of the substrates with insulating material;
    (e) fusing the insulating material to electrically insulate the metal surfaces;
    (f) selectively coating the insulating material with an adhesive coating in preparation for forming conductors by metallization;
    (g) electrolessly plating the conductor pattern with electrically conductive material;
    (h) feeding the lead frame and plurality of printed wiring boards through a blanking press for removing the lead frame from the plurality of printed wiring boards;
    (i) mounting the electrical components; and
    (j) bending the printed wiring board and at least one conductor formed thereon to cause portions of the printed wiring board to define at least two major planes.

7. A method of manufacturing printed wiring boards having angled members according to claim 6 wherein the sheet metal is ferrous or non-ferrous metal selected from the group consisting of steel, aluminum, and copper and alloys thereof.

8. A method of manufacturing printed wiring boards with angled members comprising:
    (a) forming a metal substrate from sheet metal;

(b) coating the metal substrate with an insulating material;

(c) forming conductor patterns on the insulated substrate;

(d) bending the insulated substrate and at least one conductor pattern formed thereon to cause portions of the printed wiring board to define at least two major planes; and (e) forming a plurality of conductors on the insulating material in areas defined by the conductor patterns.

9. A method of manufacturing printed wiring boards with angled members comprising:

(a) blanking sheet metal for outlining a plurality of metal substrates;

(b) forming lead frames adjacent horizontally disposed edges of the sheet metal with sprocket holes therein for use in advancing the sheet metal;

(c) preparing the substrates for coating with a layer of insulating material;

(d) coating the surfaces of the substrates with insulating material;

(e) fusing the insulating material to electrically insulate the metal surfaces;

(f) coating the insulating material with a photosensitive material;

(g) selectively exposing the photosensitive material to form a layer defining a pattern of exposed photosensitive material;

(h) electrolessly plating the exposed photosensitive material with electrically conductive material;

(i) feeding the lead frame and plurality of printed wiring boards through a blanking press for removing the lead frame from the plurality of printed wiring boards;

(j) mounting the electrical components; and (k) bending the printed wiring board and at least one conductor formed thereon to cause portions of the printed wiring board to define at least two major planes.

10. A method of manufacturing a printed wiring board with angled portion comprising the steps of:

(a) forming a metal substrate;

(b) electrostatically applying an insulating material to said substrate;

(c) fusing the insulating material to said substrate;

(d) additively depositing a plurality of conductors on the insulating material after the application thereof to said substrate; and (e) bending the insulated metal substrate and at least one conductor deposited thereon, thereby causing the insulated substrate to occupy at least two major planes.

* * * * *